United States Patent
Dunklee et al.

(10) Patent No.: US 10,261,124 B2
(45) Date of Patent: Apr. 16, 2019

(54) MODULAR RAIL SYSTEMS, RAIL SYSTEMS, MECHANISMS, AND EQUIPMENT FOR DEVICES UNDER TEST

(71) Applicant: CELADON SYSTEMS, INC., Burnsville, MN (US)

(72) Inventors: John L. Dunklee, Tigard, OR (US); William A. Funk, Lakeville, MN (US); Bryan J. Root, Apple Valley, MN (US)

(73) Assignee: CELADON SYSTEMS, INC., Burnsville, MN (US)

( * ) Notice: Subject to any disclaimer, the term of this patent is extended or adjusted under 35 U.S.C. 154(b) by 0 days.

(21) Appl. No.: 16/066,990

(22) PCT Filed: Dec. 28, 2016

(86) PCT No.: PCT/US2016/068950
§ 371 (c)(1),
(2) Date: Jun. 28, 2018

(87) PCT Pub. No.: WO2017/117257
PCT Pub. Date: Jul. 6, 2017

(65) Prior Publication Data
US 2019/0011498 A1    Jan. 10, 2019

Related U.S. Application Data

(60) Provisional application No. 62/271,711, filed on Dec. 28, 2015.

(51) Int. Cl.
*G01R 31/00* (2006.01)
*G01R 31/28* (2006.01)

(52) U.S. Cl.
CPC ..... *G01R 31/2891* (2013.01); *G01R 31/2874* (2013.01); *G01R 31/2887* (2013.01)

(58) Field of Classification Search
CPC ...... G01R 31/02; G01R 31/04; G01R 31/043; G01R 31/048; G01R 31/0466;
(Continued)

(56) References Cited

U.S. PATENT DOCUMENTS 5,003,254 A    3/1991    Hunt et al.
5,489,855 A    2/1996    Poisel
(Continued)

FOREIGN PATENT DOCUMENTS

JP    H11-174107 A    7/1999

OTHER PUBLICATIONS

International Search Report and Written Opinion, International Patent Application No. PCT/US2016/068950, dated Apr. 10, 2017 (8 pages).

*Primary Examiner* — Thang X Le
(74) *Attorney, Agent, or Firm* — Hamre, Schumann, Mueller & Larson, P.C.

(57) ABSTRACT

The systems, apparatuses, and methods herein can provide a multi-site positioning mechanism suitable for long-term testing of a device(s) under test (DUT) (e.g. semiconductor wafers) across a range of temperatures with or without a controlled environment. The systems, apparatuses, and methods herein include mounting components, mechanisms, and structures that can provide excellent mechanical stability, permit relatively close working distance optics with high resolution, enable fine positioning at elevated temperature in a controlled environment with minimal thermal perturbation. The systems, apparatuses, and methods herein can be provided with modularity, for example as modular with rails and test sites that can be easily added or removed, and that can permit access to probe modules in a densely packed array.

28 Claims, 15 Drawing Sheets

(58) Field of Classification Search
CPC ............ G01R 31/2891; G01R 31/2887; G01R 31/2886; G01R 31/2862; G01R 31/2868; G01R 31/2896; G01R 31/2893
See application file for complete search history.

(56) References Cited

U.S. PATENT DOCUMENTS

| | | | | |
|---|---|---|---|---|
| 6,031,384 | A * | 2/2000 | Furuta | G01R 31/01 324/757.04 |
| 7,053,639 | B1 | 5/2006 | Fyfield | |
| 2003/0189555 | A1 * | 10/2003 | Yamashita | G06F 3/041 345/173 |
| 2010/0052716 | A1 * | 3/2010 | Lou | G01R 31/2886 324/754.01 |

* cited by examiner

MODULAR RAIL SYSTEMS, RAIL SYSTEMS, MECHANISMS, AND EQUIPMENT FOR DEVICES UNDER TEST

FIELD

This disclosure generally relates to a multi-site precision positioning mechanism, and more particularly, an apparatus for positioning multiple probe arrays for devices under test (DUT), e.g. the testing of semiconductor devices in a semiconductor wafer, over a wide temperature range.

BACKGROUND

Semiconductor circuit elements continue to get smaller. Smaller technologies can require larger test sample sizes and lower stress, longer duration tests.

With smaller devices also come manufacturing pressures to reduce electrical contact pad sizes. Smaller contact pads can require greater probe positioning accuracy, both in XY and in Z. Probe technologies designed for smaller pads can also have a smaller margin of error in Z overtravel before they are damaged. A result may be small mechanical perturbations, which may not be a problem with relatively larger pads, e.g. 100 or 200 µm sized pads, but can cause probes to miss their pads with relatively smaller pads, e.g. 30 or 40 µm sized pads, or can even damage probes designed for smaller pads.

In U.S. Pat. No. 6,011,405, XY position of sites are determined by crossed rods. Arrays have the disadvantage of moving multiple sites with each rod. Site crosstalk makes fine adjustment a tedious, iterative process. Stiffness of the rods is an issue, both vertically and laterally. Low vertical stiffness can cause the probes to sag in the middle. Accidental application of force to the top of the array can damage probe modules. Low lateral stiffness can cause the rod to curve during adjustments from friction at the sites. Stresses built-up during alignment due to friction can relax over time with small vibrations or changes in temperature, causing drift of probe position. Mechanisms at individual sites, along with the height of two rods, limit microscope working distance. Probe card access from underneath can be cumbersome. Double-sided wedge card that probes multiple die works for one die spacing.

In U.S. Pat. No. 7,436,171, the use of individual probe sites on rails is shown, with the rail position providing gross positioning in one XY axis and with position of the site on the rail providing the other gross XY position. Each site has four fine position adjustments in X, Y, Z and about one axis. A tilting feature enables access to the probe cards for replacement from above. This design has several drawbacks. The site/rail and rail/platen interfaces rely on linear bearing trucks and rails. The trucks are elastically preloaded, which limits their stiffness. Careful matching during manufacture can improve stiffness, but can make it difficult to add trucks to the rails in the future. Additionally, position is controlled by a balance of forces that can change readily with changes in temperature of system components. Another issue with the design is access to probe cards. Tilting of the rail to change probe cards requires space. In a closely-spaced array with parallel rails, it may be necessary to move multiple rails to access one bad card on one rail. Space constraints drive the need for a relatively thin rail that can readily deflect under low loads. A soft touch may be needed to keep the rail from deflecting during site adjustments, depending on for example the span between platen guides. Additionally, the height of the fine positioning mechanism can limit microscope working distance and optical resolution.

In U.S. Pat. No. 8,402,848, versatile probe modules on positioner arms, where 3-axis positioners have bases that tilt in one or two axes. The arms cover a lot of the wafer, limiting the number of sites that can be tested simultaneously. The arms are different shapes. Over temperature changes, the arms may distort differently. Probe module planarization adjustments provided by the tilt bases are offset from the probes, which can cause large changes in Z at the probes and which can have different behavior for different arm types.

SUMMARY

This disclosure generally relates to a multi-site precision positioning mechanism, and more particularly, to systems, apparatuses, and methods for positioning multiple probe arrays for device(s) under test (DUT), e.g. the testing of semiconductor devices in a semiconductor wafer, over a wide temperature range.

Embodiments disclosed herein relate generally to systems, apparatuses, and methods which are suitable in enclosed environments that can control light, atmosphere and/or electromagnetic interference. Test temperatures of a DUT, e.g. a wafer, can range from −65 to 30° C. and higher. Some tests have measurements at multiple temperatures. The systems, apparatuses, and methods herein can finely align multiple sites and at desired temperatures and ranges. The systems, apparatuses, and methods herein can provide a controlled environment to minimize thermal perturbations or the impact thereof, which may cause probes to drift out of alignment, such as when the system returns to thermal equilibrium.

The systems, apparatuses, and methods herein can provide a multi-site positioning mechanism suitable for long-term testing of a DUT (e.g. semiconductor wafers) across a range of temperatures with or without a controlled environment. The systems, apparatuses, and methods herein can provide excellent mechanical stability, permit relatively close working distance optics with high resolution, enable fine positioning at elevated temperature in a controlled environment with minimal thermal perturbation. The systems, apparatuses, and methods herein can be provided with modularity, for example as modular components, for example with rails and test sites that can be easily added or removed, and that can permit access to probe modules in a densely packed array.

The systems, apparatuses, and methods herein can provide for multi-site testing of semiconductor wafers, the benefits of which include easy adjustment to different wafer layouts and performance of tests over a wide range of temperatures.

The Detailed Description below refers to the drawings and describes embodiments of features of the systems, apparatuses, and methods herein, while the aspects that follow provide examples of general recitations of such features.

DRAWINGS

These and other features, aspects, and advantages of the will become better understood when the following detailed description is read with reference to the accompanying drawings, wherein.

Figure 3:
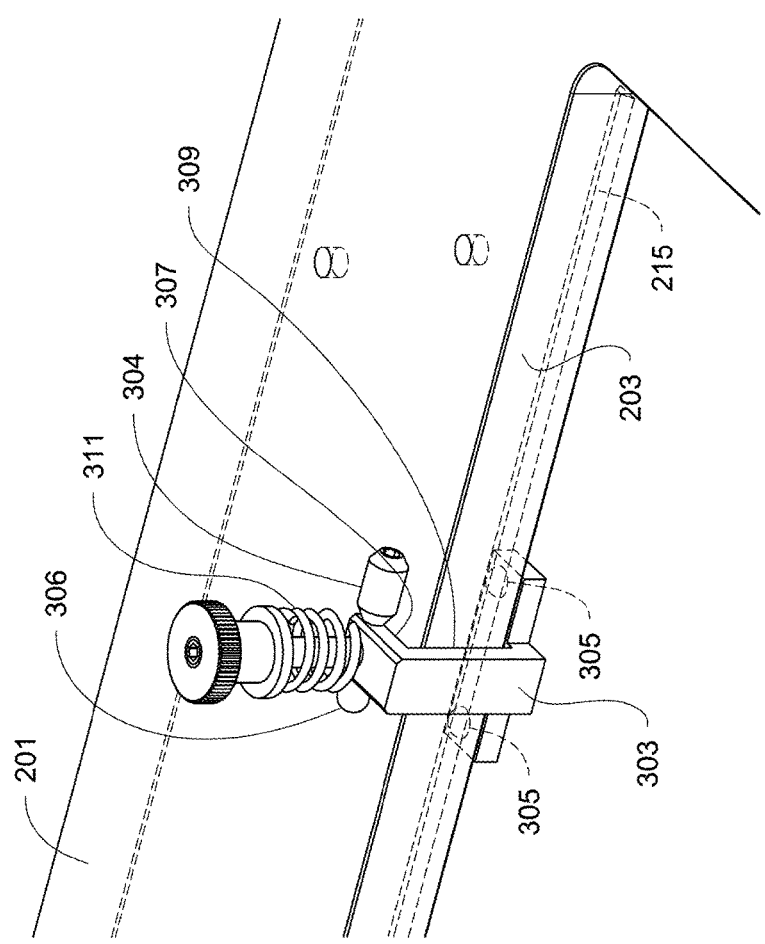
FIG. 3 shows a close-up and perspective view of an embodiment of a clamp as a component of a bracket assembly of the multi-site positioning mechanism that mounts and positions rails of the multi-site positioning mechanism to the frame of the multi-site positioning mechanism.
Figure 4:
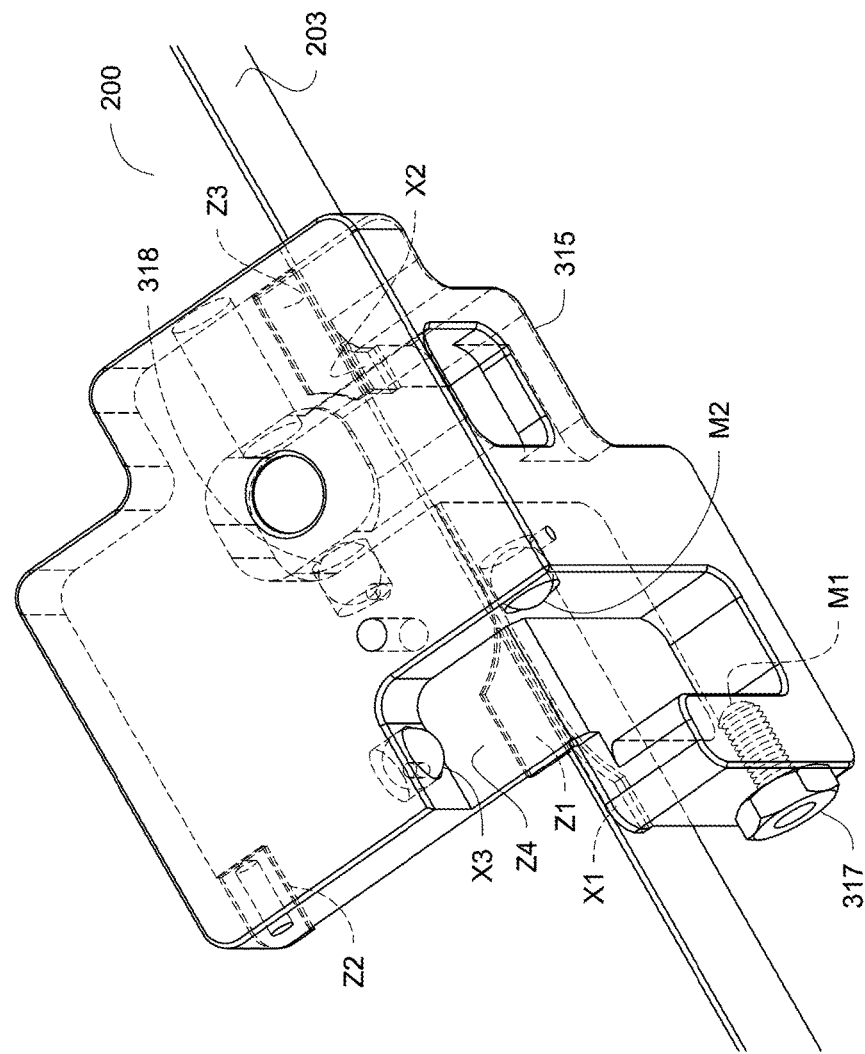
FIG. 4 shows a close-up and perspective view of an embodiment of a bracket body of a bracket assembly of the multi-site positioning mechanism and showing contacts between the bracket body and the frame, and contacts for mounting the rail to the bracket body.
Figure 5A:
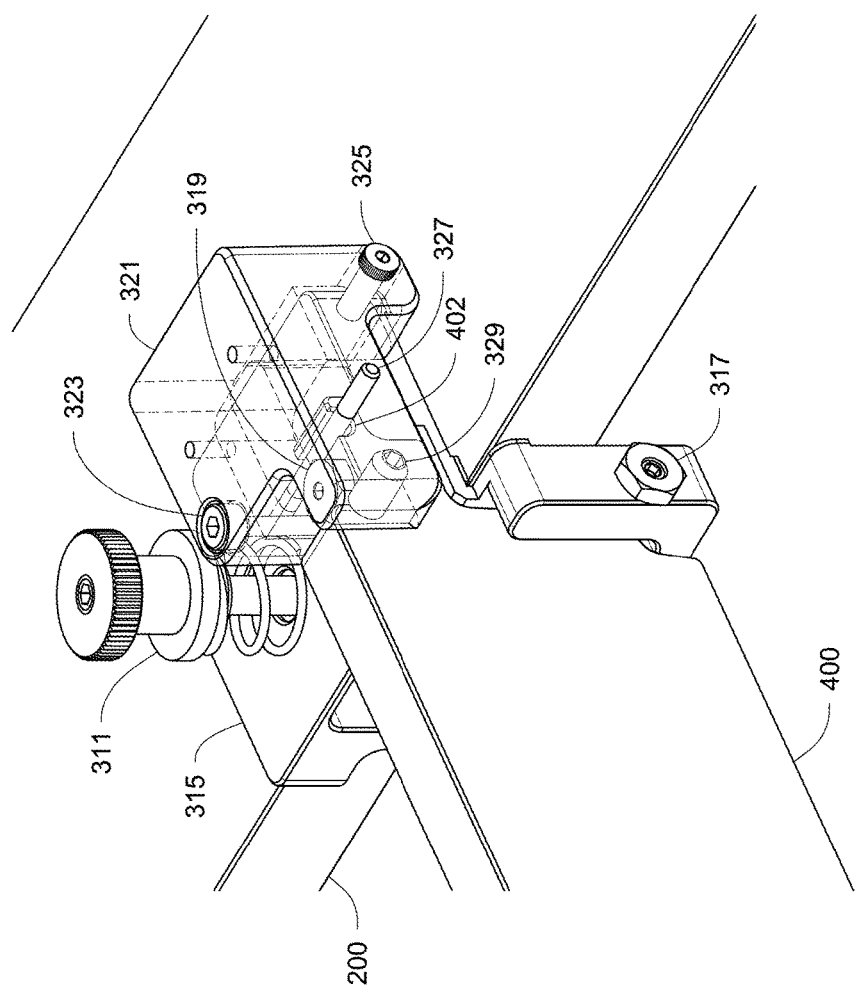
Figure 5B:
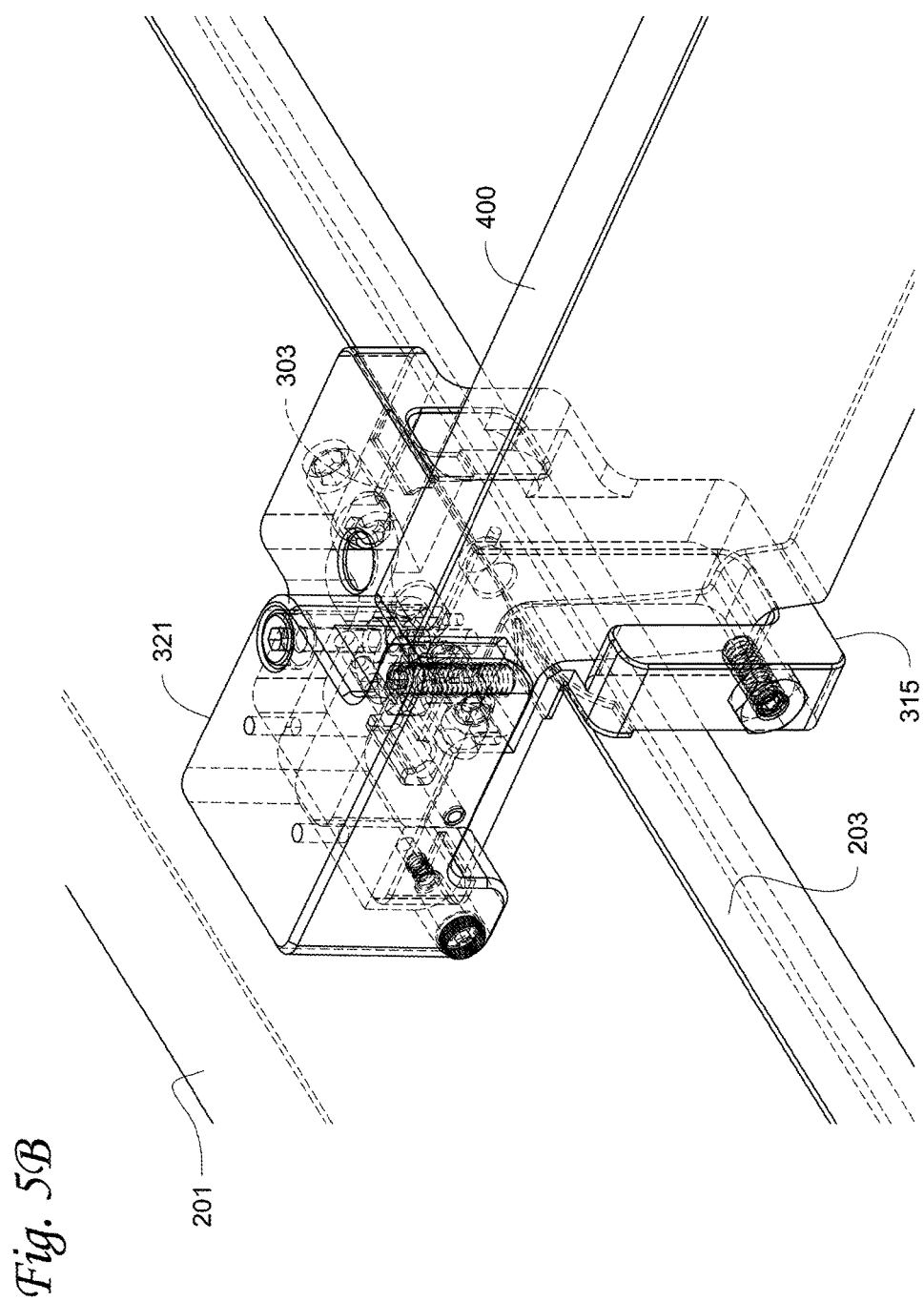

FIG. 5A shows a close-up and perspective view of an embodiment of a bracket assembly incorporating the clamp of FIG. 3 and the bracket body of FIG. 4, and showing an embodiment of a retention cap to retain the rail (partially shown) to the bracket body. FIG. 5B also shows a close-up and perspective transparent view of an embodiment of a bracket assembly incorporating the clamp of FIG. 3 and the bracket body of FIG. 4, and showing an embodiment of a retention cap to retain the rail (partially shown) to the bracket body.

Figure 6A:
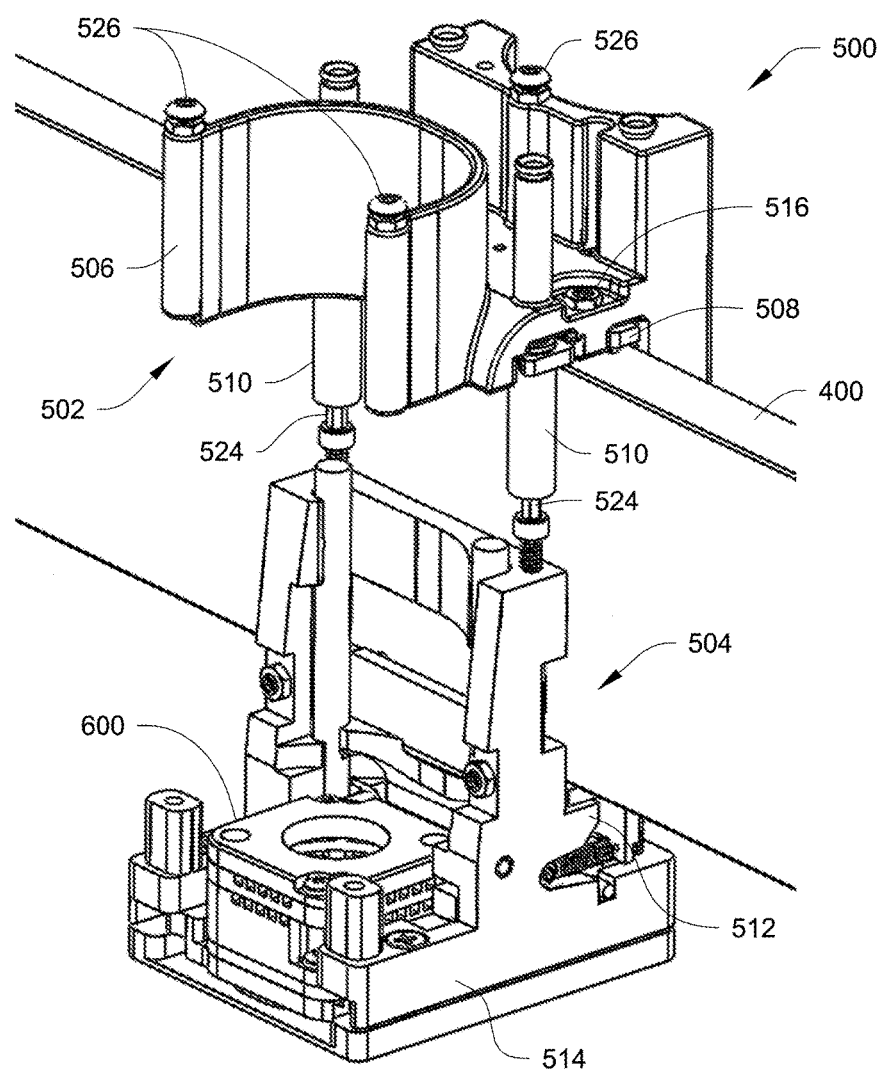
Figure 6B:
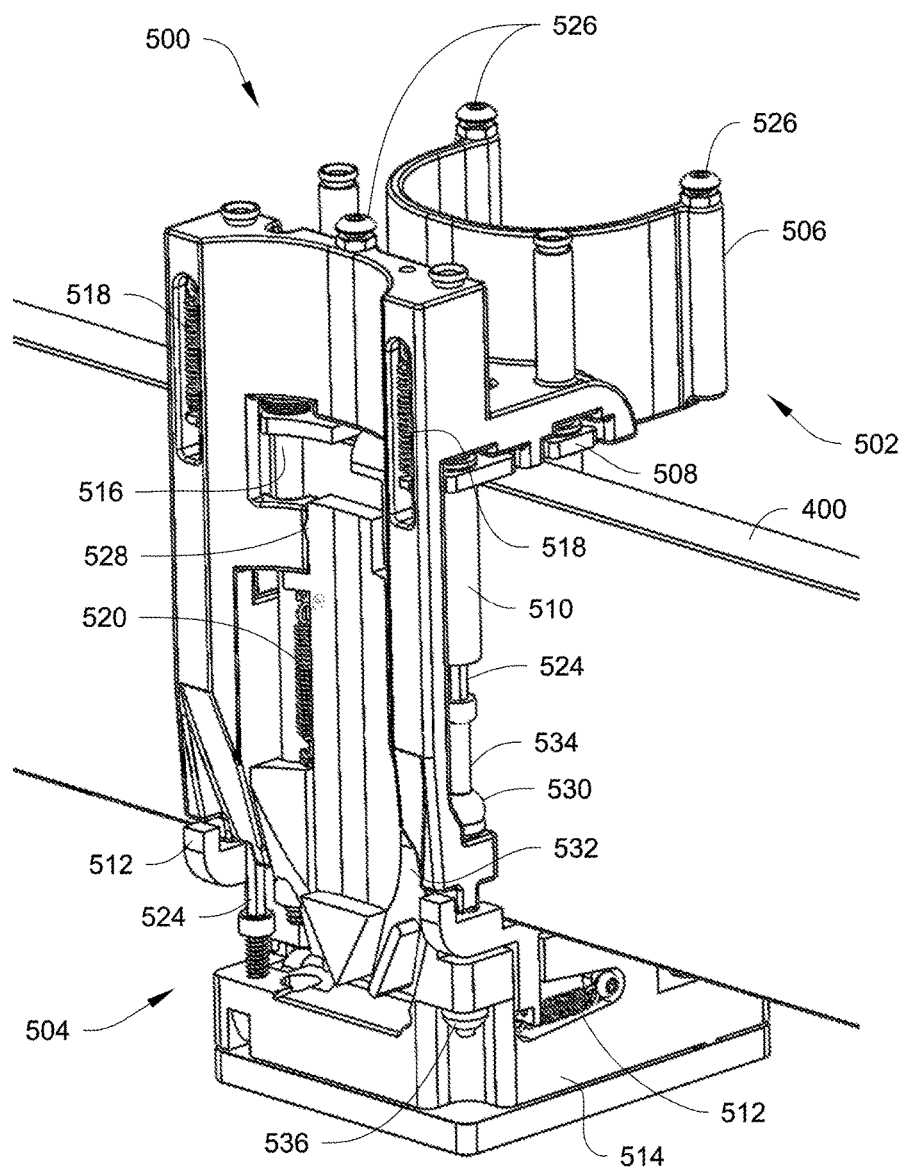
Figure 6C:
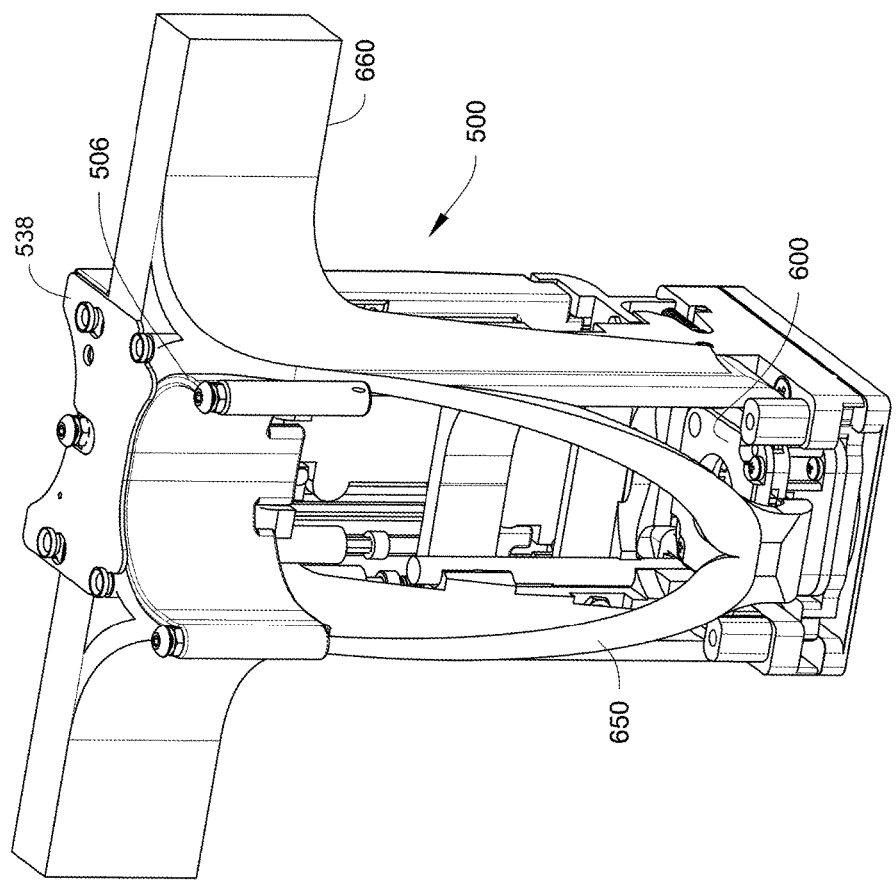

FIGS. 6A and 6B show a close-up and perspective view of an embodiment of a site assembly with probe module installed, as shown from near (on left) and far (on right) sides of a rail, respectively. FIG. 6C shows an embodiment of a site assembly showing connector, cable paths.

Figure 7A:
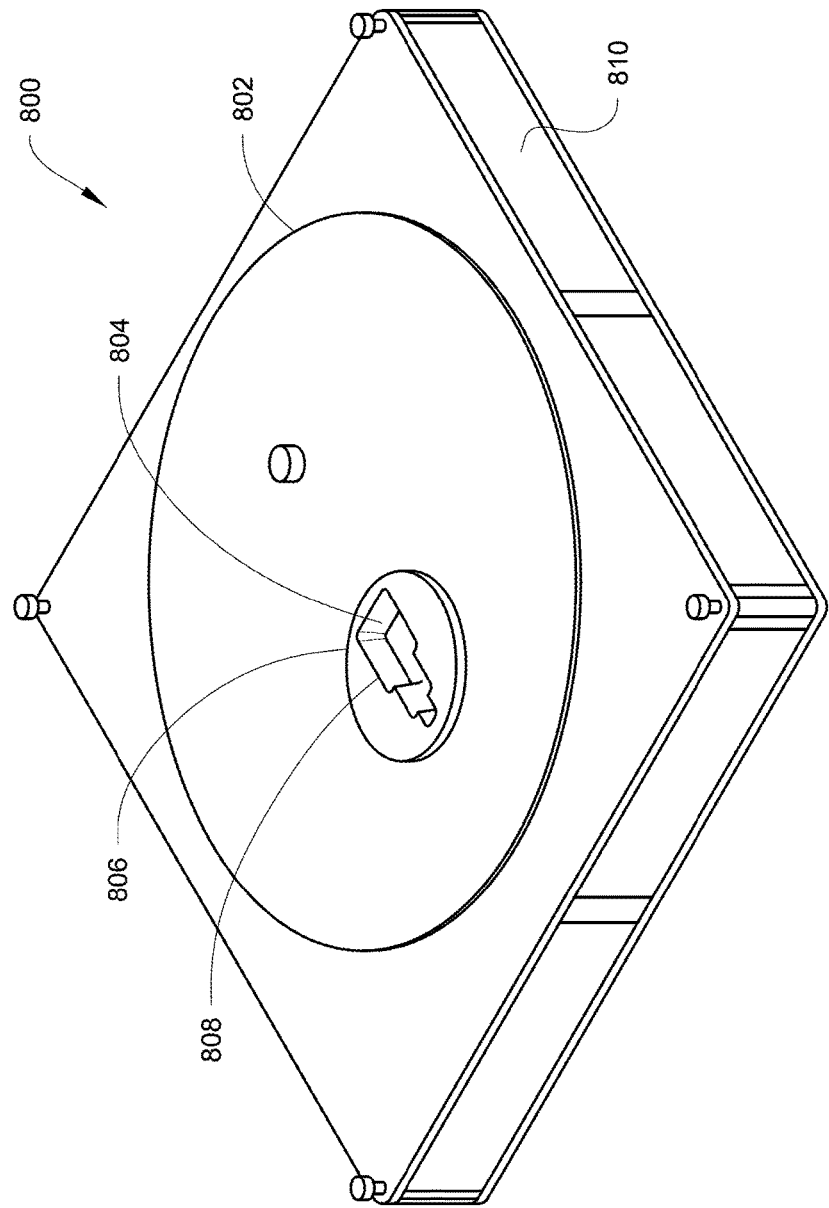
Figure 7B:
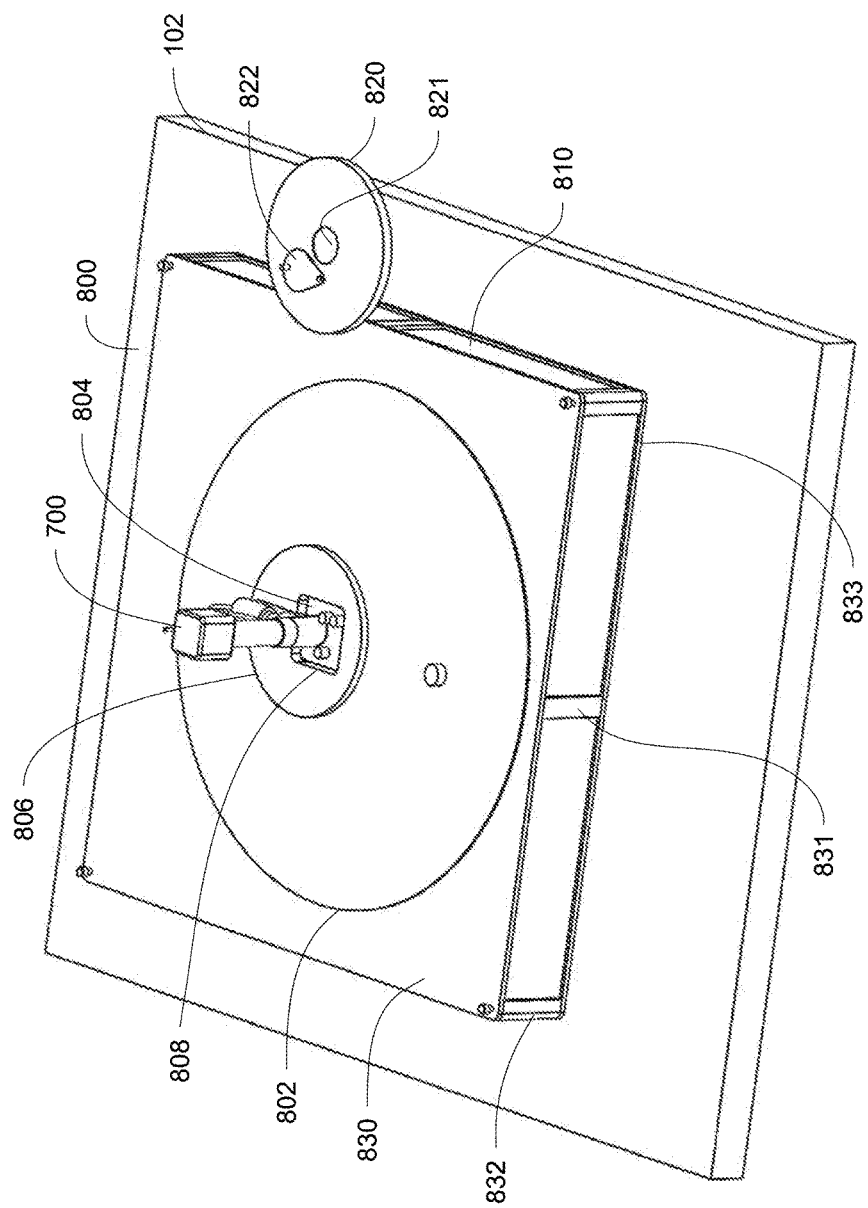

FIG. 7A shows a perspective view of an embodiment of an enclosure with a sliding plate and small access port for a lifting tool. FIG. 7B shows a perspective view of another embodiment of an enclosure.

Figure 8:
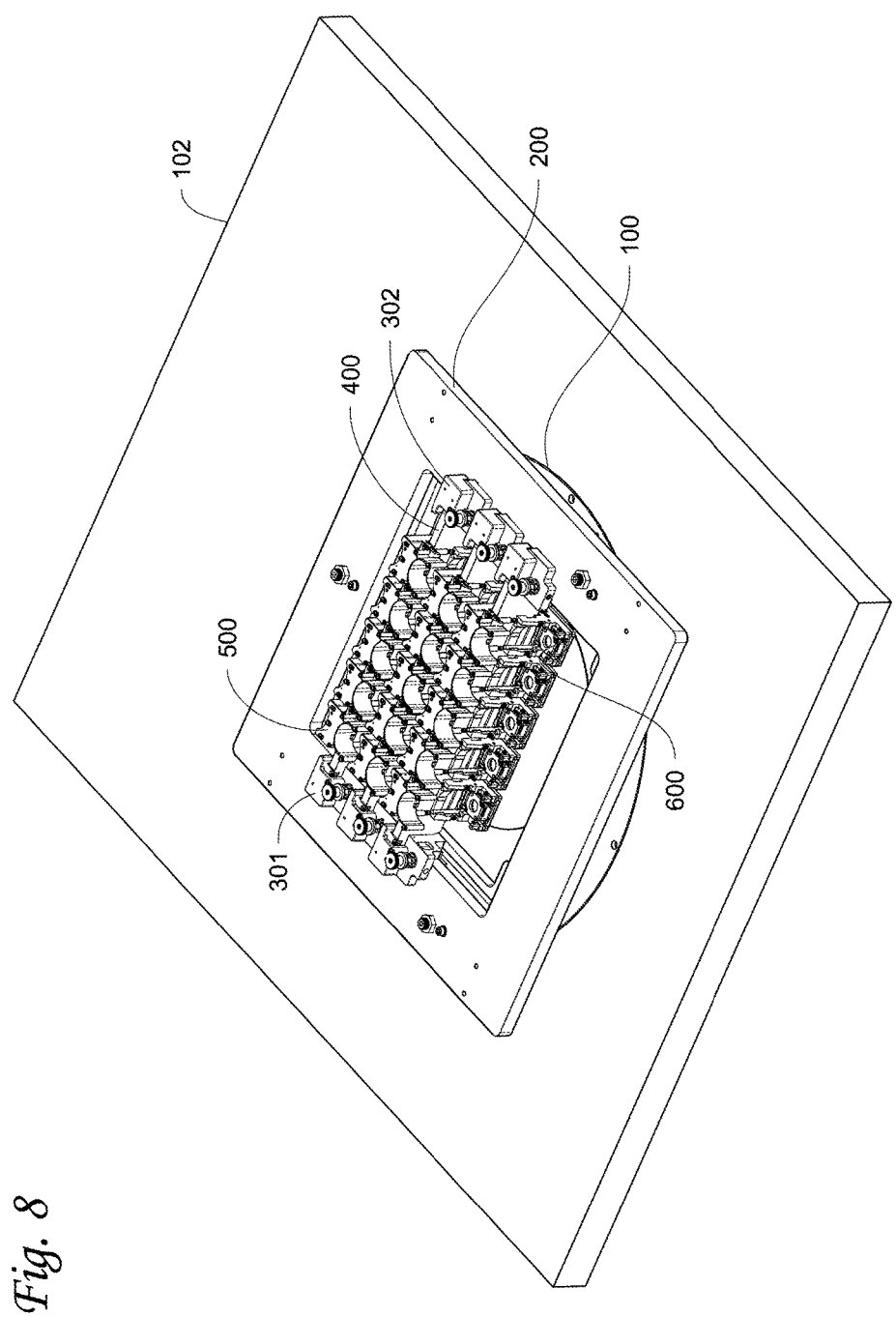

FIG. 8 shows a perspective view of an embodiment of a multi-site positioning mechanism with multi-site and multi-rail.

Figure 9A:
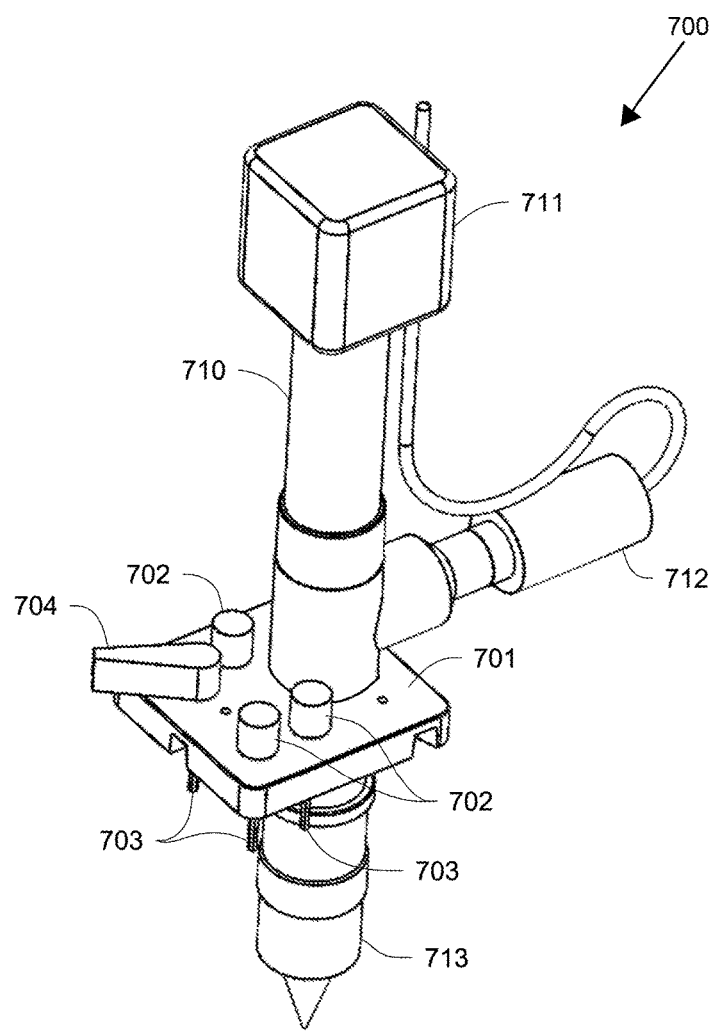
Figure 9B:
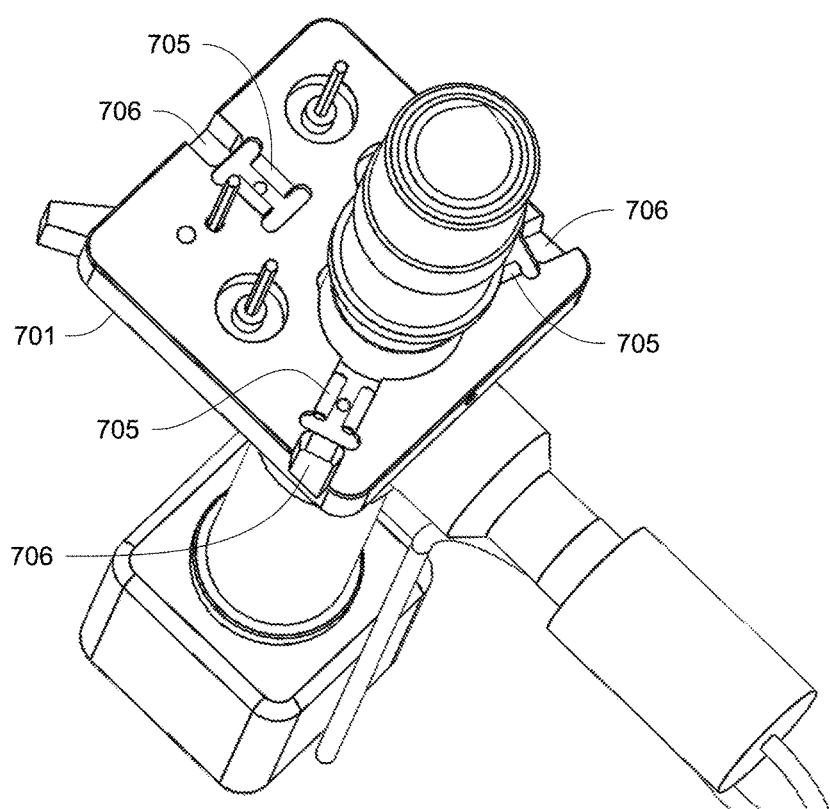

FIG. 9A shows a perspective view of an embodiment of a fine adjustment tool. FIG. 9B shows another perspective view of the fine adjustment tool of FIG. 9A.

Figure 10:
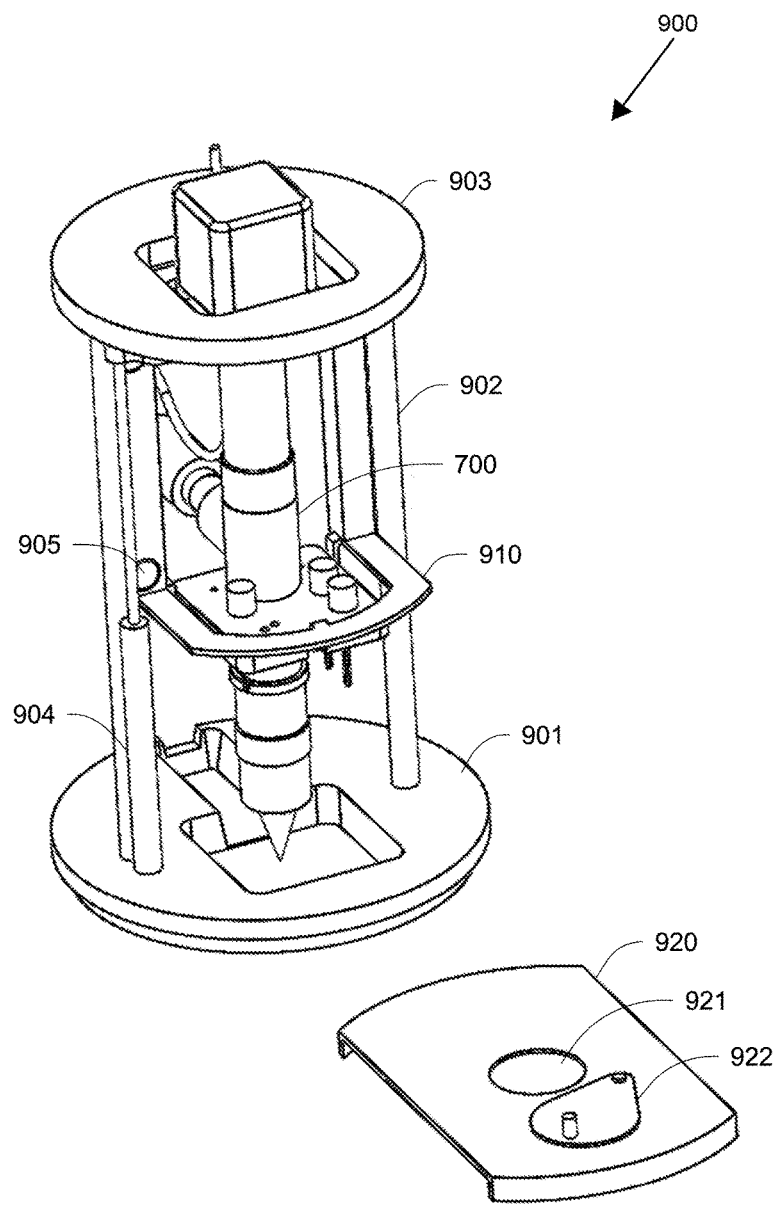

FIG. 10 shows a perspective view of a tool lift.

DETAILED DESCRIPTION

Embodiments disclosed herein relate generally to a multi-site precision positioning mechanism, and more particularly, to systems, apparatuses, and methods for positioning multiple probe arrays for device(s) under test (DUT), e.g. the testing of semiconductor devices in a semiconductor wafer, over a wide temperature range.

Embodiments disclosed herein relate generally to systems, apparatuses, and methods which are suitable in enclosed environments that can control light, atmosphere or electromagnetic interference. Test temperatures of a DUT, e.g. a wafer, can range from −65 to 300 C and higher. Some tests have measurements at multiple temperatures. The systems, apparatuses, and methods herein can finely align multiple sites and at desired temperatures and ranges. The systems, apparatuses, and methods herein can provide a controlled environment to minimize thermal perturbations or the impact thereof, which may cause probes to drift out of alignment, such as when the system returns to thermal equilibrium.

The systems, apparatuses, and methods herein can provide a multi-site positioning mechanism suitable for long-term testing of a DUT (e.g. semiconductor wafers) across a range of temperatures with or without a controlled environment. The systems, apparatuses, and methods herein can provide excellent mechanical stability, permit relatively close working distance optics with high resolution, enable fine positioning at elevated temperature in a controlled environment with minimal thermal perturbation. The systems, apparatuses, and methods herein can be provided with modularity, for example as modular components, for example with rails and test sites that can be easily added or removed, and that can permit access to probe modules in a densely packed array.

The systems, apparatuses, and methods herein can provide for multi-site testing of semiconductor wafers, the benefits of which include easy adjustment to different wafer layouts and performance of tests over a wide range of temperatures.

Figure 1:
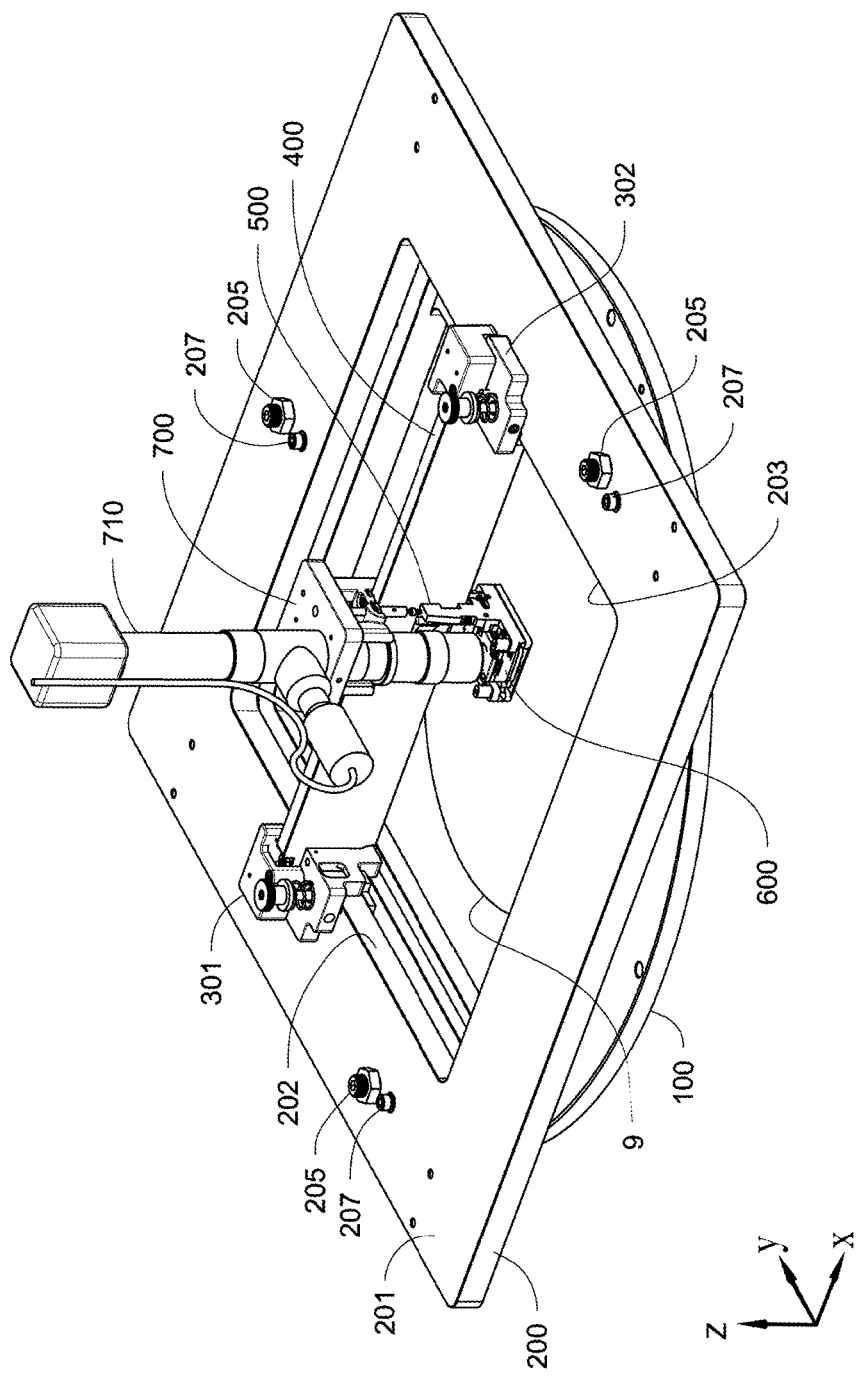
FIG. 1 shows a perspective view of an embodiment of a multi-site positioning mechanism.

FIG. 1 shows a perspective view of an embodiment of a multi-site positioning mechanism. The multi-site positioning mechanism is shown with one rail 400 and one probe site 500. It will be appreciated that the multi-site positioning mechanism may be configured to carry multiple probe sites on the rail 400 and/or include multiple rails 400 each with one or more probe sites thereon, and where multiple mounting components such as bracket assemblies (further described below and shown in FIG. 8) may be employed to assemble the rails as part of the multi-site positioning mechanism.

In an embodiment, the multi-site positioning mechanism may also include an enclosure (shown in FIGS. 7A and 7B) and/or a tool lift (shown in FIG. 10).

In FIG. 1, an embodiment of a prober platen insert 100, which may be designed for a specific prober, is mounted to a prober platen which may be a frame to hold the prober platen insert 100, for example a suitable plate or platform onto or into which the prober platen insert 100 may be suitably mounted. In an embodiment, the prober platen insert 100 is made from the same material as the prober platen. In such a case, shifting can be minimized between prober platen insert 100 and the prober platen over changes for example in tests or environmental conditions such as for example temperature.

In an embodiment, a frame 200 mounts to the prober platen insert 100. In an embodiment, the frame 200 is rectangular and the like, but it will be appreciated that the frame 200 may be other shapes as suitable and/or desired. In an embodiment, the frame 200 provides a flat plane on a top face 201. In an embodiment, the top face 201 is parallel to a wafer 9. In an embodiment, the wafer 9 is supported and positioned by a prober chuck. In an embodiment, the frame 200 includes two parallel faces 202, 203.

In an embodiment, bracket assemblies 301, 302 contact the frame 200 top face 201, and one of the faces 202, 203. As shown, two bracket assemblies 301, 302 are on the frame 200 to mount a rail 400. It will be appreciated that more bracket assemblies may be employed as additional rails 400 are mounted to the frame 200.

In an embodiment, the rail 400 is supported by the bracket assemblies 301, 302.

In an embodiment, a site assembly 500 mounts to the rail 400. One site assembly 500 is shown, however, it will be appreciated that the rail 400 and/or additional rails like rail 400 for example may include additional site assemblies 500.

In an embodiment, a probe tile assembly 600 mounts to the site assembly 500. It will be appreciated that interconnect cables, guides, paths (see e.g. FIG. 6C) are employed as needed for example to provide suitable electrical connections.

In an embodiment, a fine adjustment tool assembly 700 interfaces to the site assembly 500 and includes a microscope assembly 710.

For purposes of the description, the Z axis is perpendicular to the wafer 9, the Y axis runs parallel along the length of the frame faces 202 and 203 and perpendicular to the Z axis, and the X axis is perpendicular to the Y and Z axes.

In an embodiment of use, a probe module 600 is mounted to the site assembly 500 and the fine adjustment tool assembly 700 is mounted to the site assembly 500. The brackets 301, 302 slide along the frame 200 for gross Y positioning and can be clamped to the frame 200. The site assembly 500 slides along the rail 400 for gross X positioning and can be clamped to the rail 400. The microscope tool assembly 710 provides visual feedback during positioning. Once gross positioning is complete, the fine adjustment tool assembly 700 can actuate positioning mechanisms in the site assembly 500 for fine X, Y, Z and rotation of the probe module 600 about the Z axis.

In an embodiment, for installations with multiple sites, e.g. site assemblies 500 and/or with multiple rails 400, the tool assembly 700 can be moved from site to site without altering the position of the sites. In an embodiment, gross positioning is performed during initial setup at ambient temperature. In an embodiment, fine positioning is performed at test temperature, after the system has reached thermal equilibrium.

In an embodiment, for applications in a dark or shielded environment, the tool assembly 700 can be inserted through a small port of an enclosure (shown in and described below with respect to FIGS. 7A and 7B), which can minimize perturbations to thermal equilibrium. In an embodiment, for applications requiring a fully controlled environment, a tool lift which may be a motorized tool, which may include a gantry can be used to lift and move the tool from site to site, so it can make the fine adjustments.

An advantage of this system is the ability of the tool to move from site to site without disturbing the positions of the probe modules mounted to the sites. In an embodiment, this capability is enabled by the combination of high rigidity system components, a site assembly 500 design that couples tool loads directly to the rail 400 while isolating the probe module 600, and a unique kinematic design that provides exact constraint for most system components while ensuring the probe tips do not drop in Z if kinematic contacts are separated.

For a detailed discussion of "exact constraint", see "Exact constraint: Machine design using kinematic principles" by douglass L. Blanding, ASME Press, 1999. In short, a three dimensional body has 6 degrees of freedom, motion in the X, Y and Z directions as well as rotation about these three axes. With exact constraint design, these degrees of freedom are controlled with 6 constraints. In the case of the multi-site positioning mechanism herein, these constraints can take the form of contact points or small contact pads between components. A nesting force keeps each pair of contacts mated. In the contact direction, the interface in an embodiment is relatively rigid and repeatable. Over wide temperature ranges, as components change size, nesting forces determine contact forces. A potential disadvantage of kinematic contacts is that a contact between two components separate when a counter force greater than the nesting force is applied (in a direction opposite the nesting force). Though the component will return to its' original position when the counter force is removed, it is of little benefit if separation of the contact drives the probes into the wafer, damaging them. The crash-resistant kinematic contact arrangements described in more detail below can help provide reliable use of an exact constraint design.

Figure 2:
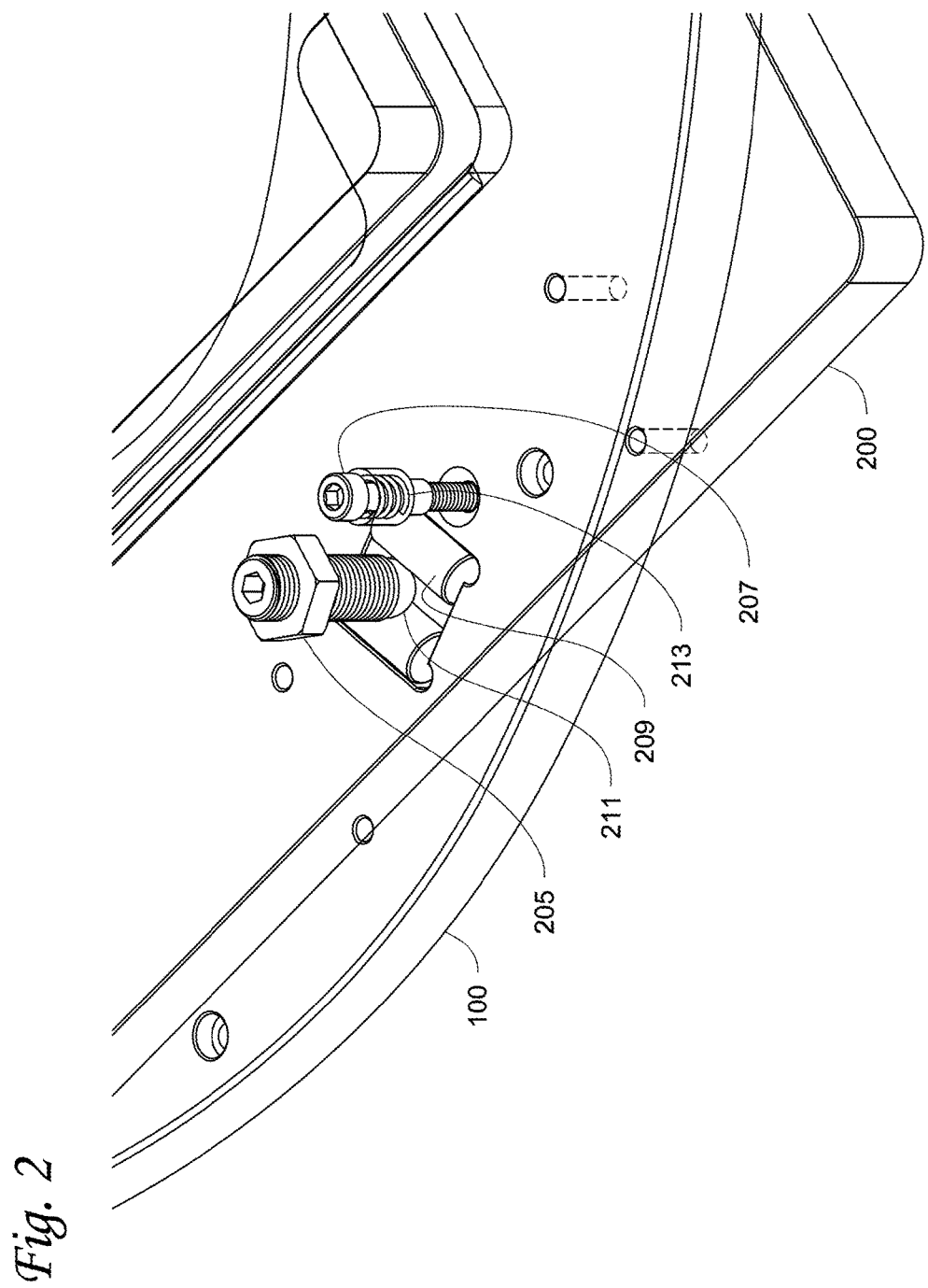
FIG. 2 shows a partial close-up and perspective view of the multi-site positioning mechanism and of an embodiment of an interface of a frame of the multi-site positioning mechanism with a prober platen insert.

FIG. 2 shows a partial close-up and perspective view of the multi-site positioning mechanism of FIG. 1 and of an embodiment of a kinematic interface of a frame of the multi-site positioning mechanism with a prober platen insert.

In an embodiment, the prober platen insert 100 has three (3) vees, for example made from pairs of parallel cylinders 209, which are oriented toward the center of the prober platen insert 100. In an embodiment, the frame 200 has three (3) adjustment screws 205 with ball ends 211 that align with the vees. In an embodiment, lock nuts or the like on the adjustment screws 205 lock the adjustment screws. In an embodiment, a hold-down screw 207 or the like is located near each adjustment screw 205 to prevent the frame 200 from falling off the prober platen insert 100 in the event there is a high force applied to the frame (e.g. an earthquake). In an embodiment, the hold down screws 207 may include a compression spring 213. FIG. 1 shows the three sets of adjustment screws 205 and hold-down screws 207 for three interface regions between the prober platen insert 100 and the frame 200. FIG. 2 shows one of the three interface regions between the platen insert 100 and the frame 200. In an embodiment, the kinematic interface formed by the three interface regions form a Kelvin clamp kinematic interface, with three balls in three vee grooves.

FIG. 3 shows a close-up and perspective view of an embodiment of a clamp 303 as a component of a bracket assembly of the multi-site positioning mechanism that mounts and positions rails 400 of the multi-site positioning mechanism to the frame 200 of the multi-site positioning mechanism.

In FIG. 3, an embodiment of a bracket-frame kinematic interface is shown by way of an exemplary clamp mechanism. With reference to FIG. 1, rail 400 is supported by a bracket assembly 301, 302 at each end. In an embodiment, the bracket assemblies 301, 302 each contain a clamp 303 that wraps around the edge of the frame 200, e.g. around the faces 201, 202 or 203, and the bottom of the frame 200. In an embodiment, two balls 305 bonded into the lower part of the clamp 303 slide along a groove 215, e.g. shown as a V groove, in the bottom face of the frame 200. In an embodiment, when the clamping screw 311 is tightened, the clamp 303 grips the frame 200 tightly. The clamp 303 has two perpendicular faces 307, 309 that are also generally parallel to the XZ plane. A spring plunger 304 in the bracket pushes the clamp against a ball contact 306 and contact location 318 in the bracket 315 (see FIG. 4). When the clamp 303 is loosened, it slides along with the bracket assembly 301, 302 as it is moved. When the clamp 303 is tightened, it restricts motion of the bracket assembly 301, 302 in the Y direction. In an embodiment, the clamp 303 restricts motion of the bracket assembly 301, 302 without significantly preventing other motion of the bracket assembly over relatively small displacements.

In an embodiment, the clamp 303 is in the bracket body 315 (see e.g. FIGS. 5A and 5B). FIG. 4 shows a close-up and perspective view of an embodiment of a bracket body 315 of a bracket assembly 301, 302 of the multi-site positioning mechanism and showing contacts between the bracket body 315 and the frame 200, and contacts for mounting the rail 400 to the bracket body 315. FIG. 4 shows an embodiment of a rail-bracket kinematic interface, with an embodiment of contacts between the rail 400 and bracket body 315.

In an embodiment, the bracket body 315 contacts the frame 200 for example at five contact pads made from a polymer bearing material. In an embodiment, contacts Z1, Z2, and Z3 restrict motion of the bracket in the Z direction. In an embodiment, about the X and Y axes, contacts X1 and X2 restrict motion in the X direction and about the Z axis. The clamp 303, spring plunger 304 and ball 306 shown in FIG. 3 are omitted from FIG. 4 for clarity. It will be appreciated that bracket assemblies can be added and removed from the frame 200.

For purposes of description, the bracket body 315 is shown in a transparent view relative to its features/contacts and the frame 200. In an embodiment, an oval-tipped screw 319 (see e.g. FIG. 5A) passing vertically through each end of the rail 400 lands on the bracket at location Z4 of the bracket body 315 to control the Z position of the end of a rail 400. In an embodiment, the screw 319 can be adjusted to planarize the top of the rail 400 to the DUT array. At one end of the rail 400, adjustable contact M1 and fixed ball contact M2 contact the two faces of the rail 400, preventing it from rotating about the X axis. A ball contact X3 contacts the rail 400 at the end, preventing it from moving in X.

In an embodiment, a screw 317 inserts through the bracket body 315 to fix the rail 400 for example in YZ (see e.g. FIGS. 4, 5A, and 5B).

At the other end of the rail 400, in an embodiment, a spring plunger can replace the X3 contact and the M1 contact can be omitted. Spring force from the plunger keeps both brackets against their X1 and X2 contacts and the rail against the X3 contact.

FIG. 5A shows a close-up and perspective view of an embodiment of a bracket assembly incorporating the clamp of FIG. 3 and the bracket body of FIG. 4, and showing an embodiment of a retention cap 321 to retain the rail (partially shown) to the bracket body. It will be appreciated that FIG. 5A resembles the bracket assembly 301 of FIG. 1, which includes the clamp 303, bracket body 315 and their respective components described above relative to FIGS. 3 and 4. However, the bracket assembly shown in FIG. 5A is the mirror image of the orientation of the clamp 303 and bracket body 315 shown in FIGS. 3 and 4, which are of the bracket assembly 302 in FIG. 1.

Further shown in FIG. 5A, in an embodiment, the retention cap 321 rotates, for example about a screw 325, and can be fixed to the bracket body 315 with a screw 323. It will be appreciated that bracket assemblies 301, 302 have a cap (see e.g. FIG. 1), where one cap 321 is shown in detail in FIG. 5A. In the fixed position, the cap 321 in an embodiment retains the rail 400 so it does not lift very far off the bracket body 315. In an embodiment, the cap 321 contains a ball plunger 329 that biases the rail 400 against contacts M1 and M2. A pin 327 in the cap nests in a feature 402 in the rail 400. If one of the caps 321 is open on one end of the rail 400 and the other cap is fixed, the rail 400 can be lifted at the open end to add or remove site assemblies 500. The pin 327 and rail feature 402 at the fixed end prevent the rail 400 from pulling out. Either end of the rail 400 can be lifted for site assembly access, or the entire rail can be lifted off if both caps 321 are open.

FIG. 5B also shows a close-up and perspective transparent view of an embodiment of a bracket assembly incorporating the clamp of FIG. 3 and the bracket body of FIG. 4, and showing an embodiment of a retention cap 321 to retain the rail (partially shown) to the bracket body. FIG. 5B resembles the bracket assembly 302 of FIG. 1, which includes the clamp 303, bracket body 315, the retention cap 321, and their respective components described above relative to FIGS. 3, 4, and 5A. The bracket assembly shown in FIG. 5B includes the clamp 303 and bracket body 315 shown in FIGS. 3 and 4 describe above and assembled together with the retention cap 321, but is the mirror image of the orientation of the bracket assembly shown in FIG. 5A. It will be appreciated that the dashed lines would be hidden when the view is not transparent.

FIGS. 6A and 6B show a close-up and perspective view of an embodiment of a site assembly 500 with probe module 600 installed, as shown from near (on left) and far (on right) sides of a rail, respectively. In an embodiment, FIGS. 6A and 6B show a site-rail kinematic interface. In an embodiment, the site assembly 500 has an upper portion 502 and a lower portion 504. In an embodiment, the upper portion 502 includes a saddle 506, upper clamp 508, isolators 510 that can be driven with a tool and features for joining with the tool in a kinematic clamp. In an embodiment, the lower portion includes a lower clamp 512 and a carriage assembly 514 with X, Y, θz fine positioning stage driven by screws. In an embodiment, a screw 516 between the upper and lower clamps is loosened to move the site along the rail. In an embodiment, a spring biases the saddle against the upper clamp in X. In an embodiment, when the screw 516 between the clamps 508, 512 is tightened, the clamps 508, 512 rigidly grip the rail 400 and prevent the site 500 from moving in X. In an embodiment, when the clamping screw 516 is loosened, the site assembly moves freely along the rail 400.

In an embodiment, the saddle 506 has two contacts with the top of the rail, one contact near the top of the rail on the vertical face near the probe module (near side) and two contacts toward the bottom of the rail on the other vertical face (far side). In an embodiment, two vertical extension springs 518 between the saddle 506 and upper clamp 508 apply a moment to the saddle that keeps the near and far contacts against the rail.

In an embodiment, the carriage 514 has two contacts against the near side of the rail near the bottom and one contact on the far side near the top. In an embodiment, two extension springs between the carriage and lower clamp 512 apply a moment that keeps the contacts against the rail. In an embodiment, on the far side, there are two contacts 528, 532 between the carriage 514 and saddle 506. In an embodiment, a vertical extension spring 520 between the carriage and saddle pulls down on the carriage. In an embodiment, this spring is also located off center in X so that it applies a moment about the Y axis that keeps the two carriage/saddle contacts engaged.

In an embodiment, a differential screw 534 on the far side of the rail 400 controls the Z position of the carriage 514. In an embodiment, the screw 534 has coarse threads on the top half and fine threads in the bottom half. In an embodiment, the coarse portion of the screw 534 engages a ball 530 with threaded hole that rests in an upward facing 60 degree countersink. In an embodiment, the fine portion of the screw 534 engages a ball 536 with a threaded hole that is in a downward facing 60 degree countersink in the carriage. In an embodiment, when the differential screw 534 is turned clockwise (when observed from above), it advances down at a higher rate while the lower ball 536 rises up the screw at a lower rate, resulting in the carriage moving down at a very low rate. In an embodiment, hex shafts 524 extend from the stage drive screws to the isolators 510 that are driven by the tool to enable the carriage to move in Z while the tool interface remains at the same level.

In an embodiment, the location of the differential screw 534 on the far side of the rail 400, in combination with the contact arrangement described minimizes the risk that the probe module 600 will be damaged if any of the contact restraints are overpowered and a contact separates. In an embodiment, if excessive force is applied to the near side of the saddle 506, the saddle 506 may tip down on the near side. In an embodiment, with the differential screw 534 on the far side, this can raise the carriage 514 and probe module 600. Similarly, when the carriage 514/rail 400 or carriage 514/saddle 506 contacts are lifted, the probe module 600 may be lifted.

In an embodiment, a tool-site kinematic interface includes three button head screws 526 at the top of the saddle 506 engage in three vee grooves on the underside of the tool 700, forming a very repeatable kinematic clamp. In an embodiment, the screws can be adjusted to set tool height and to center the probes in the microscope field of view and have jam nuts to lock their positions. In an embodiment, one or more magnets in the tool 700 and/or site assembly 500 can assist in restraining the tool/site contacts. In an embodiment of use, the tool 700 is set on the site assembly 500.

FIG. 6C shows an embodiment of a site assembly resembling site assembly 500 and also showing connector, cable paths. Site assembly 500 are shown with an embodiment of cable path regions 650, 660. In an embodiment, the probe module 600 can have 20-50 individual cables attached to it that are connected to individual probes. In some cases, two cables are connected to each probe for kelvin measurements. In an embodiment, cables are electrically insulated from one another and may be either single conductor, coaxial or other configurations such as twisted pair or strip line. In an embodiment, cables connect the probes to test instrumentation. For ease of use, for example, the cables permanently attached to the probe modules are about 1 meter in length. In an embodiment, additional cable extensions, switch matrices, patch panels and other electrical interconnect devices may be in the electrical path between the probe module and test instrumentation.

Cables are guided from the probe module 600 by the curved upper portion of the saddle 506 along paths 650. Note the paths 650 are intended to approximate the boundaries of multiple individual wires. Guiding the cables along paths 650 helps ensure the region directly above the probe module 600 remains clear for a microscope. Toward the top of the site assembly, the cable paths 650 merge into a rectangular cable path 660 defined by the saddle 506 and cable cover 538. The cable cover 538 helps ensure cables do not protrude above the site assembly. Cables from the probe module 600 can be routed to either side of the site assembly 500 so as to be guided to the closest end of the rail 400. The rectangular cable path 660 may carry cables from several probe modules.

FIG. 7A shows a perspective view of an embodiment of an enclosure 800 with a sliding plate 802 and small access port 804 for a lifting tool to manipulate tool assembly 700. In an embodiment, for applications in a dark, shielded, and/or dry environment, enclosure 800 with one or more sliding plates 802 on the top can be added to the system. Shown in FIG. 7 is a single sliding plate that can be slid or rotated with access port 804 located off-center. In an embodiment, several successively smaller plates with successively smaller access ports/holes in their center may be employed. In an embodiment, the plate(s) 802 enable a small access port(s) 804 to be positioned over any site 500 location. In an embodiment, a cover 806 blocks the access port 804 when the tool 700 is not in place. In an embodiment, a window 808 in the cover 806 permits the port 804 to be aligned to a site without opening it and the tool 700 blocks the port 804 when in place to minimize thermal perturbations when operating at elevated temperatures, or to minimize moisture when operating at low temperatures. In an embodiment, sidewalls 810 in the enclosure 800 are removable and can be replaced with interface panels for routing electrical signals through the enclosure walls. In an embodiment, the enclosure top is removable for system setup and gross alignment.

In an embodiment, tool lift (see e.g. FIG. 10), or the like can include a lift mechanism which can be placed on top of the enclosure 800 sliding plates or supported by a gantry, or arm(s), or suitable mechanism. In an embodiment, the tool lift is pneumatic, with a pneumatic cylinder pulling the tool down at a controlled rate. In an embodiment, when the air is turned off, an extension spring returns the tool to the raised position. This arrangement would ensure the tool does not drop if air pressure is lost. In an embodiment, stroke of the lift is enough to completely remove the tool 700 from the enclosure 800 so the access port 804 can be closed when the tool 700 is in the raised position. A damper in the lift or tool 700 can further reduce approach speed to minimize impact force on the site assembly. Some of the weight of the tool 700 can be supported by the lift or enclosure 800 in the down position via compression springs.

FIG. 7B shows a perspective view of another embodiment of an enclosure. For example, in applications in a dark, shielded and/or dry environment, an enclosure 800 with one or more sliding plates on the top can be added to the system. Shown in FIG. 7B is a single sliding plate 802 that can be slid or rotated with an access port 804 located off-center. The port 804 includes a hole in an alignment disc 806 that is slightly larger than the tool base 701 (see e.g. FIGS. 9A and 9B). An alternative is several successively smaller plates with successively smaller holes in their center. In either case, the plates enable the small access port to be positioned over any site location. Different from FIG. 7A, in an embodiment, a cover assembly 820 blocks the access port when the tool 700 is not in place. In and embodiment, a window 821 in the cover assembly 820 permits the port 804 to be aligned to a site 500 without opening it and a pivoting shade 822 can be pivoted over the window 821 during testing for light sensitive measurements. In an embodiment, the tool 700 or cover assembly 820 blocks the port 804 to minimize thermal perturbations when operating at elevated temperatures, or to minimize moisture when operating at low temperatures. In an embodiment, the sliding plate 802 slides on a top plate 830, which is supported by posts 831, 832. In an embodiment, the posts are mounted to a bottom plate 833, which is mounted to the prober platen 102. In an embodiment, sidewalls 810 in the enclosure are removable and can be replaced with interface panels for routing electrical signals through the enclosure walls. In an embodiment, the entire enclosure top (830, 802, 806, 820) is removable for system setup and gross alignment.

FIG. 8 shows an embodiment of a multi-site positioning mechanism with multi-sites 500 and multi-rails 400. Similar features as in FIG. 1 are shown including bracket assemblies 301, 302, the prober platen insert 100 assembled with a probe platen 102, as well as the frame 200 and probe modules 600. In FIG. 8, system assembly is shown without enclosure, tool lift, or cables. Probe platen 102 is shown, which may also be known as a prober head plate.

In an embodiment, the multi-site, multi-rail configuration shows five sites per rail, showing three rails for a three rail by five site (15 sites) configuration.

It will be appreciated that the tool 700 can be moved to any of the sites 500, and that an enclosure, e.g. enclosure 800, can enclose configuration.

FIG. 9A shows a perspective view of an embodiment of a fine adjustment tool 700. FIG. 9B shows another perspective view of the fine adjustment tool of FIG. 9A.

In FIG. 9A, tool 700 includes in an embodiment a base plate 701 with control knobs 702 for fine XYZ adjustments, theta adjustment, microscope movement and/or focusing, clamping knob 704, and an optical assembly (710, 711, 712, 713). It will be appreciated that more or less knobs than shown may be employed as desired and/or suitable. In an embodiment, the control and clamping knobs 702, 704 are free to rotate in the base plate 701 and may have a little play so they can move side to side a small distance a. Extending from the bottom of the knobs are hexagonal drive shafts 703 that engage with isolator assemblies in the site assembly when the tool is lowered on a site. The clamping knob 704 can be removed after site assemblies 500 have been grossly aligned. The microscope assembly includes a tube microscope body 710, a video camera 711, a microscope light 712 and microscope objective 713.

In FIG. 9B, the bottom of the base plate 701 is shown. In an embodiment, the tool 700 includes three vees made from pairs of dowel pins 705 bonded into the base plate 701. When the tool 700 is placed on a site assembly 500, convex surfaces on the site 500 engage with the vees to form a Kelvin clamp kinematic interface. The small amount of play in the knobs ensures the kinematic interface controls position of the tool 700. Also visible from the bottom are three pockets 706 that engage with the tool lift (see FIG. 10) as it rises.

FIG. 10 shows a perspective view of an embodiment of a tool lift. In an embodiment, a lift mechanism 900 can be placed on top of the enclosure sliding plates 802, 830 (see FIG. 7B) in place of the alignment disc 806 and/or supported by a gantry or arm. In an embodiment, the tool lift includes a base plate 901 that supports two linear shafts 902, which terminate at a top plate 903. In an embodiment, a cradle assembly 910 has rollers 905, bushings or other linear motion elements that restrain motion to the Z direction. In an embodiment, the cradle assembly 910 carries the tool 700 when the tool 700 is not nested with a site assembly 500. In an embodiment, when the tool 700 is nested with a site and the lift is in the down position, the cradle assembly 910 does not contact the tool 700. In an embodiment, the tool lift is pneumatic, with a pneumatic cylinder 904 pulling the tool down at a controlled rate. In an embodiment, when the air is turned off, an extension spring returns the tool to the raised position. This arrangement can ensure that the tool does not drop if air pressure is lost. In an embodiment, stroke of the lift is enough to completely remove the tool from the enclosure so the access port can be closed with a cover assembly 920 when the tool is in the raised position. A window 921 in the cover enables aligning the lift with a site without leaving the access port 804 open. A shutter 922 in the cover can be closed to cover the window for light sensitive measurements. It will be appreciated that FIG. 10 shows a similar but differently shaped cover assembly than cover assembly 820. In an embodiment, a damper in the lift or tool can further reduce approach speed to minimize impact force on the site assembly. In an embodiment, some of the tool weight can be supported by the lift or enclosure in the down position via compression springs.

X, Y and Z directions are arbitrary and based on the convention of an XY planar array approached in the Z direction. Likewise, "above" is in the Z direction from which the DUT array can be observed and tested. Nothing in this disclosure should be taken to limit orientation of these X, Y and Z directions in 3-d space. For example, if the DUT array is in a vertical plane, "above" could be to the left or right of the array, depending on orientation.

ASPECTS

The aspects below describe in general terms features and elements described above with respect to FIGS. 1-8. It will be appreciated that any of the following aspects 1-28 may be combined with any of the listed aspects.

Aspect 1

A probe module positioning system to observe and test arrays of devices under test (DUT) comprising:
a support member including:
a planar surface parallel to array, and
two linear guide features that are parallel to a direction (Y) of the DUT array, the guide features being separated in a direction (X) that is perpendicular to the direction (Y) so that the DUT array is disposed therebetween;
at least two brackets supported in a direction (Z) by the planar surface of the support member, the direction (Z) being perpendicular to the direction (X) and the direction (Y), the at least two brackets being movable along the two linear guide features in the direction (Y) and configured to be restricted from moving along the guide features and from moving perpendicular to the guide features in at least one direction relative to the direction (Y), with at least one of the brackets guided by one of the two linear guide features such that at least one of the brackets is disposed on a side of the DUT array;
at least one rail supported above the DUT array at each end by the at least two brackets, the at least two brackets being disposed on opposite sides of the DUT array such that the rail can be positioned perpendicular to the two linear guide features and parallel to the direction (X), the at least two brackets controlling a position of the ends of the rail in the direction (Y) and the direction (Z) and at least one of the brackets also controlling a position of the rail in the direction (X) and at least one of the brackets controlling rotation of the rail about a longitudinal axis of the rail;
at least one site assembly that can carry a probe module and that is prevented from moving in at least one of the direction (Y) and the direction (Z) and about (X), (Y), and (Z) axes in at least one direction of the rail, the at least one site assembly being positioned along the rail, the at least one site assembly can be restricted from moving along the rail, the site assembly including at least one fine positioning stage for positioning the probe module relative to the site assembly in the direction (X), the direction (Y), or the direction (Z), or about the (X), (Y), or (Z) axes; and a tool that includes optics for viewing a DUT, a control, or an actuator for at least one site assembly fine positioning axis, that can be aligned with the site assembly to actuate at least one fine positioning stage in the site assembly.

Aspect 2

The system of aspect 1, wherein the support member is a rectangular plate supported by a platen insert which can be planarized relative to the DUT array.

Aspect 3

The system of aspect 2, wherein the planarization is provided by three ball end screws engaged in threaded holes in the plate, the ball ends nesting in three vee grooves or pairs of parallel cylindrical faces in the prober platen insert, thereby forming a kinematic clamp between the support member and platen insert.

Aspect 4

The system of any one of aspects 2-3, wherein the support member has a rectangular hole in a center of the support member, creating a frame shape, with two parallel vertical faces of the hole being the guide features.

Aspect 5

The system of any one of aspects 1-4, wherein each bracket has three contacts against the planar surface of the support member and two contacts against one of the guide features.

Aspect 6

The system of aspect 5, wherein the bracket contacts are held against their respective guide features by a force normal to the guide features and generally along the length of the rail (X axis), with the rail taking part in transmitting the force between the two brackets.

Aspect 7

The system of any one of aspects 1-6, wherein each bracket is spring-biased against a clamp which does not interfere with bracket motion when loosened and which restrains bracket motion along the guide features when tightened, but does not interfere with the other 5 degrees of freedom of the bracket.

Aspect 8

The system of any one of aspects 1-7, wherein each site assembly is spring-biased against a clamp which does not interfere with site assembly motion when loosened and which restrains site motion along the rail when tightened but does not interfere with the other 5 degrees of freedom of the site assembly.

Aspect 9

The system of any one of aspects 1-8, wherein the tool mates with the site assembly in a kinematic clamp and can be moved from site assembly to site assembly.

Aspect 10

The system of aspect 9, wherein the support member, brackets, rails, and site assemblies are in an enclosure, with the platen insert forming a bottom side of the enclosure, the enclosure having a top side having one or more sliding plates to permit an access port to be positioned over any location where the site assembly can be positioned, the access port can be opened or closed.

Aspect 11

The system of aspect 10, wherein the access port is large enough to allow the tool to mate with the site assembly.

Aspect 12

The system of aspect 11, wherein the tool substantially seals the access port when in place to minimize airflow in or out of the enclosure.

Aspect 13

The system of any one of aspects 1-12, further comprising a tool lift to raise and lower the tool.

Aspect 14

The system of aspect 12, further comprising a tool lift to raise and lower the tool, the tool lift being supported by the sliding plates, in an up position, the tool is outside of the enclosure and the access port can be closed, and in the down position, the tool mates with the site assembly.

Aspect 15

The system of aspect 13, wherein some of the tool weight is carried by the tool lift in the down position.

Aspect 16

The system of any one of aspects 1-15, wherein the rail has a rectangular cross-section and is oriented so that major surfaces of the rail are perpendicular to the DUT array.

Aspect 17

The system of any one of aspects 1-16, wherein the probe module is mounted to the site assembly on one side of the rail, access to the probe module for installation or removal also serves as tool microscope access when the tool is in use at the site assembly.

Aspect 18

The system of any one of aspects 1-17, where the site assembly has upper and lower portions, the upper portion interfaces with the tool and supports the lower portion in the direction (Z) and prevents the lower portion from rotating about the (Y) axis, and the lower portion supports the probe module.

Aspect 19

The system of aspect 18, wherein the upper portion is clamped to the rail.

Aspect 20

The system of any one of aspects 18-19, wherein the upper portion is biased against the clamp.

Aspect 21

The system of any one of aspects 18-20, wherein the upper portion has two contacts against a top of the rail that keep the site assembly from dropping in the direction (Z) or rotating about the (Y) axis, two contacts spaced horizontally against one side of the rail, and one contact against the other side of the rail, contacts on one side of the rail are disposed relatively toward the top of the rail relative to the bottom of the rail and contacts on the other side of the rail are disposed relatively toward the bottom of the rail relative to the top of the rail, the lower portion is located on the side of the rail with the lower contacts.

Aspect 22

The system of any one of aspects 18-21, wherein the lower portion is adjustable, enabling the lower portion to be moved in the direction (Z), wherein fine positioning mechanisms in the lower portion are actuated rotationally, with a sliding coupling transmitting torque while allowing vertical motion.

Aspect 23

The system of aspect 22, wherein the lower portion has two contacts spaced against one side of the rail and one contact against the other side of the rail.

Aspect 24

The system of any one of aspects 1-23, wherein the brackets have pivoting caps that retain the end of the rail when secured and enable the rail to be lifted up when open.

Aspect 25

A system, comprising:
the probe module positioning system to observe and test arrays of devices under test (DUT) according to aspect 1;
an enclosure, wherein the support member, brackets, rails, and site assemblies are disposed within the enclosure; and
a tool lift disposed on a top side of the enclosure for manipulating a location of the tool.

Aspect 26

The system of aspect 25, wherein the tool lift is pneumatically controlled.

Aspect 27

A method of positioning a probe module for observing and testing arrays of devices under test (DUTs), the method comprising:
grossly positioning a site assembly carrying the probe module along at least one rail, the at least one rail being supported above a DUT array at each end by at least two brackets, the at least two brackets disposed on opposite sides of the DUT array such that the rail can be positioned perpendicular to two linear guide features and parallel to a direction (X), the at least two brackets controlling a position of the ends of the rail in the direction (Y) and the direction (Z) and at least one of the brackets also controlling a position of the rail in the direction (X) and at least one of the brackets controlling rotation of the rail about a longitudinal axis of the rail; and finely positioning the probe module along at least one of the direction (X), the direction (Y), the direction (Z), and rotation about a (Z) axis using the site assembly, thereby positioning the probe module for test.

Aspect 28

The method of aspect 27, wherein the grossly positioning the site assembly includes securing the at least one rail and the at least two brackets in a first kinematic interface and the at least two brackets and the two linear guide features in a second kinematic interface.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, indicate the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts, without departing from the scope of the present disclosure. The word "embodiment" as used within this specification may, but does not necessarily, refer to the same embodiment. This specification and the embodiments described are examples only. Other and further embodiments may be devised without departing from the basic scope thereof, with the true scope and spirit of the disclosure being indicated by the claims that follow.

The invention claimed is:

1. A probe module positioning system to observe and test arrays of devices under test (DUT) comprising:
a support member including:
a planar surface parallel to a DUT array, and
two linear guide features that are parallel to a direction (Y) of the DUT array, the two linear guide features being separated in a direction (X) that is perpendicular to the direction (Y) so that the DUT array is disposed therebetween;
at least two brackets supported in a direction (Z) by the planar surface of the support member, the direction (Z) being perpendicular to the direction (X) and the direction (Y), the at least two brackets being movable along the two linear guide features in the direction (Y) and configured to be restricted from moving along the two linear guide features and from moving perpendicular to the two linear guide features in at least one direction relative to the direction (Y), with at least one of the at least two brackets guided by one of the two linear guide features such that at least one of the at least two brackets is disposed on a side of the DUT array;
at least one rail supported above the DUT array at each end by the at least two brackets, the at least two brackets being disposed on opposite sides of the DUT array such that the rail can be positioned perpendicular to the two linear guide features and parallel to the direction (X), the at least two brackets controlling a position of the ends of the rail in the direction (Y) and the direction (Z) and at least one of the at least two brackets also controlling a position of the rail in the direction (X) and at least one of the at least two brackets controlling rotation of the rail about a longitudinal axis of the rail;
at least one site assembly that can carry a probe module and that is prevented from moving in at least one of the direction (Y) and the direction (Z) and about (X), (Y), and (Z) axes in at least one direction of the rail, the at least one site assembly being positioned along the rail, the at least one site assembly can be restricted from moving along the rail, the site assembly including at least one fine positioning stage for positioning the probe module relative to the site assembly in the direction (X), the direction (Y), or the direction (Z), or about the (X), (Y), or (Z) axes; and a tool that includes optics for viewing a DUT, a control, or an actuator for at least one site assembly fine positioning axis, that can be aligned with the site assembly to actuate at least one fine positioning stage in the site assembly.

2. The system of claim 1, wherein the support member is a rectangular plate supported by a platen insert which can be planarized relative to the DUT array.

3. The system of claim 2, wherein the planarization is provided by three ball end screws engaged in threaded holes in the plate, ball ends of the three ball end screws nesting in three vee grooves or pairs of parallel cylindrical faces in the prober platen insert, thereby forming a kinematic clamp between the support member and platen insert.

4. The system of claim 2, wherein the support member has a rectangular hole in a center of the support member, creating a frame shape, with two parallel vertical faces of the hole being the two linear guide features.

5. The system of claim 1, wherein each bracket of the at least two brackets has three contacts against the planar surface of the support member and two contacts against one of the two linear guide features.

6. The system of claim 5, wherein three contacts of the each bracket are held against their respective guide features by a force normal to the two linear guide features and generally along the length of the rail (X axis), with the rail taking part in transmitting the force between the at least two brackets.

7. The system of claim 1, wherein each bracket of the at least two brackets is spring-biased against a clamp which does not interfere with bracket motion when loosened and which restrains bracket motion along the two linear guide features when tightened, but does not interfere with the other 5 degrees of freedom of the bracket.

8. The system of claim 1, wherein each site assembly is spring-biased against a clamp which does not interfere with site assembly motion when loosened and which restrains site assembly motion along the rail when tightened but does not interfere with the other 5 degrees of freedom of the site assembly.

9. The system of claim 1, wherein the tool mates with the site assembly in a kinematic clamp and can be moved from site assembly to site assembly.

10. The system of claim 9, wherein the support member, brackets, rails, and site assemblies are in an enclosure, with a platen insert forming a bottom side of the enclosure, the enclosure having a top side having one or more sliding plates to permit an access port to be positioned over any location where the site assembly can be positioned, the access port can be opened or closed.

11. The system of claim 10, wherein the access port is large enough to allow the tool to mate with the site assembly.

12. The system of claim 11, wherein the tool substantially seals the access port when in place to minimize airflow in or out of the enclosure.

13. The system of claim 1, further comprising a tool lift to raise and lower the tool.

14. The system of claim 12, further comprising a tool lift to raise and lower the tool, the tool lift being supported by the sliding plates, in an up position, the tool is outside of the enclosure and the access port can be closed, and in a down position, the tool mates with the site assembly.

15. The system of claim 13, wherein the tool has a weight, and some of the weight of the tool is carried by the tool lift in a down position.

16. The system of claim 1, wherein the rail has a rectangular cross-section and is oriented so that major surfaces of the rail are perpendicular to the DUT array.

17. The system of claim 1, wherein the probe module is mounted to the site assembly on one side of the rail, access to the probe module for installation or removal also serves as tool microscope access when the tool is in use at the site assembly.

18. The system of claim 1, where the site assembly has upper and lower portions, the upper portion interfaces with the tool and supports the lower portion in the direction (Z) and prevents the lower portion from rotating about the (Y) axis, and the lower portion supports the probe module.

19. The system of claim 18, wherein the upper portion is clamped to the rail.

20. The system of claim 18, wherein the upper portion is biased against the clamp.

21. The system of claim 18, wherein the upper portion has two contacts against a top of the rail that keep the site assembly from dropping in the direction (Z) or rotating about the (Y) axis, two contacts spaced horizontally against one side of the rail, and one contact against the other side of the rail, contacts on one side of the rail are disposed relatively toward the top of the rail relative to the bottom of the rail and contacts on the other side of the rail are disposed relatively toward the bottom of the rail relative to the top of the rail, the lower portion is located on the side of the rail with the lower contacts.

22. The system of claim 18, wherein the lower portion is adjustable, enabling the lower portion to be moved in the direction (Z), wherein fine positioning mechanisms in the lower portion are actuated rotationally, with a sliding coupling transmitting torque while allowing vertical motion.

23. The system of claim 22, wherein the lower portion has two contacts spaced against one side of the rail and one contact against the other side of the rail.

24. The system of claim 1, wherein the at least two brackets have pivoting caps that retain the end of the rail when secured and enable the rail to be lifted up when open.

25. A system, comprising:
the probe module positioning system to observe and test arrays of devices under test (DUT) according to claim 1;
an enclosure, wherein the support member, brackets, rails, and site assemblies are disposed within the enclosure; and
a tool lift disposed on a top side of the enclosure for manipulating a location of the tool.

26. The system of claim 25, wherein the tool lift is pneumatically controlled.

27. A method of positioning a probe module for observing and testing arrays of devices under test (DUTs), the method comprising:
grossly positioning a site assembly carrying the probe module along at least one rail, the at least one rail being supported above a DUT array at each end by at least two brackets, the at least two brackets disposed on opposite sides of the DUT array such that the rail can be positioned perpendicular to two linear guide features and parallel to a direction (X), the at least two brackets controlling a position of the ends of the rail in the direction (Y) and the direction (Z) and at least one of the at least two brackets also controlling a position of the rail in the direction (X) and at least one of the at least two brackets controlling rotation of the rail about a longitudinal axis of the rail; and finely positioning the probe module along at least one of the direction (X), the direction (Y), the direction (Z), and rotation about a (Z) axis using the site assembly, thereby positioning the probe module for test.

28. The method of claim 27, wherein the grossly positioning the site assembly includes securing the at least one rail and the at least two brackets in a first kinematic interface and the at least two brackets and the two linear guide features in a second kinematic interface.

* * * * *